(12) United States Patent
Noda et al.

(10) Patent No.: US 9,514,935 B2
(45) Date of Patent: Dec. 6, 2016

(54) METHOD OF MANUFACTURING SEMICONDUCTOR DEVICE, METHOD OF PROCESSING SUBSTRATE, SUBSTRATE PROCESSING APPARATUS, AND PROGRAM

(71) Applicant: HITACHI KOKUSAI ELECTRIC INC., Tokyo (JP)

(72) Inventors: Takaaki Noda, Toyama (JP); Takeo Hanashima, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/388,160

(22) PCT Filed: Mar. 25, 2013

(86) PCT No.: PCT/JP2013/058488
§ 371 (c)(1),
(2) Date: Sep. 25, 2014

(87) PCT Pub. No.: WO2013/146632
PCT Pub. Date: Oct. 3, 2013

(65) Prior Publication Data
US 2015/0044880 A1 Feb. 12, 2015

(51) Int. Cl.
*H01L 21/02* (2006.01)
*C23C 16/455* (2006.01)
*C23C 16/46* (2006.01)
*C23C 16/52* (2006.01)
*C23C 16/50* (2006.01)
*H01L 21/311* (2006.01)

(52) U.S. Cl.
CPC ....... *H01L 21/0234* (2013.01); *C23C 16/4554* (2013.01); *C23C 16/45534* (2013.01); *C23C 16/463* (2013.01); *C23C 16/50* (2013.01); *C23C 16/52* (2013.01); *H01L 21/0228* (2013.01); *H01L 21/02164* (2013.01); *H01L 21/02211* (2013.01); *H01L 21/02271* (2013.01); *H01L 21/31111* (2013.01)

(58) Field of Classification Search
CPC ................... H01L 21/0234; H01L 21/02164; H01L 21/0221; H01L 21/0228; H01L 21/02271; H01L 21/31111; C23C 16/45534; C23C 16/4554; C23C 16/463; C23C 16/50; C23C 16/52
See application file for complete search history.

(56) References Cited

U.S. PATENT DOCUMENTS

| | | | |
|---|---|---|---|
| 7,923,386 B2 * | 4/2011 | Balseanu | H01L 21/02126 257/E21.24 |
| 2003/0082921 A1 * | 5/2003 | Peng | H01L 21/31116 438/710 |
| 2004/0180557 A1 * | 9/2004 | Park | C23C 16/402 438/787 |
| 2005/0252449 A1 | 11/2005 | Nguyen et al. | |
| 2008/0076268 A1 | 3/2008 | Kraus et al. | |

FOREIGN PATENT DOCUMENTS

| | | |
|---|---|---|
| JP | 2007-537605 A | 12/2007 |
| JP | 2009-272641 A | 11/2009 |
| JP | 2010-505281 A | 2/2010 |

* cited by examiner

*Primary Examiner* — Yasser A Abdelaziez
*Assistant Examiner* — Farun Lu
(74) *Attorney, Agent, or Firm* — Volpe and Koenig, P.C.

(57) ABSTRACT

A method of manufacturing a semiconductor device is provided, which enables the film quality to be improved when the film is formed on a substrate at a low temperature, thus forming fine patterns. The method of manufacturing a semiconductor device includes: forming the film on a substrate by alternately supplying at least a source gas and a reactive gas to the substrate while maintaining the substrate at a first temperature by heating; and modifying the film by supplying a modification gas excited by plasma to the substrate with the film formed thereon while naturally cooling the substrate with the film formed thereon to a second temperature without heating the substrate, the second temperature being lower than the first temperature.

7 Claims, 5 Drawing Sheets

METHOD OF MANUFACTURING SEMICONDUCTOR DEVICE, METHOD OF PROCESSING SUBSTRATE, SUBSTRATE PROCESSING APPARATUS, AND PROGRAM

FIELD OF THE INVENTION

The present invention relates to a method of manufacturing a semiconductor device, a method of processing a substrate, a substrate processing apparatus, and a program. More specifically, the present invention relates to a technique for processing a substrate at low temperature.

DESCRIPTION OF THE RELATED ART

Currently, a high degree of integration is being demanded for semiconductor devices, including logic devices and memory devices such as flash memories, Dynamic Random Access Memories (DRAMs) and Static Random Access Memories (SRAMs). In order to satisfy this demand, it is necessary to scale down the patterns. In order to integrate a large number of devices within a small area, each individual device needs to be downsized. More specifically, the pitch of the formed patterns, which is the sum of their widths and the spacing therebetween, needs to be decreased. However, the resolution of photolithography for use in forming necessary patterns is limited. This restricts the formation of patterns at fine pitches.

In recent years, a technique (pattern forming technique) for processing the underlayer of fine patterns on a substrate has been widely applied to, for example, the formation of ICs in the semiconductor industry, and is attracting a lot of attention. In this technique, fine patterns are formed on the substrate, and then the substrate is etched using these patterns as a mask. Accordingly, a double patterning method is increasingly studied as one of newly proposed photolithography techniques. In this method, patterning is performed at least twice to form photoresist patterns. It is said that this double patterning method makes it possible to form finer patterns than when patterning is performed only once. Therefore, a technique for performing exposure at least twice is increasingly studied as an exemplary double patterning method.

In the double patterning method, in order to form a first photoresist pattern and then form a second photoresist pattern thereon, it is necessary to configure the process so as to prevent the first photoresist pattern from being damaged upon the formation of the second photoresist pattern. However, typical resin-based photoresist materials tend to be degraded when being heated to more than 150° C. In order to prevent the deformation of the first photoresist pattern, the heat treatment is required to be given to the second photoresist pattern at a lower temperature. An exemplary technique for forming a film, such as a silicon-containing film, on a substrate at a low temperature is a method of alternately supplying a silicon-containing source gas and a modification gas (such as, oxygen-containing gas or nitrogen-containing gas). In addition, using a catalyst gas, the film can be formed at a low temperature (such as, 100° C. or less) (see Patent Literature 1).

CITATION LIST

Patent Literature

Patent Literature 1: JP 2009-272641 A

SUMMARY OF THE INVENTION

A problem with the above method is that silicon oxide films formed at low temperatures, such as 100° C. or less, exhibit a lower quality and higher etching rate than those formed at high temperatures (e.g., 700° C. or more). Such low-quality films are prone to being deformed and reduced by heat or plasma. So, when a low-quality film is used as a mask material, the pattern widths may vary widely due to etching deficiencies, resulting in device failures.

The present invention addresses problems, as described above, with an object of providing a technique for improving film qualities, thus achieving fine patterns.

According to an aspect of the present invention, a method of manufacturing a semiconductor device includes: forming a film on a substrate by alternately supplying at least a source gas and a reactive gas to the substrate while maintaining the substrate at a first temperature by heating; and modifying the film by supplying a modification gas excited by plasma to the substrate with the film formed thereon while naturally cooling the substrate with the film formed thereon to a second temperature without heating the substrate, the second temperature being lower than the first temperature.

According to an aspect of a method of manufacturing a semiconductor device according to the present invention, it is possible to improve the film quality when a film is formed on a substrate at a low temperature, thus forming fine patterns.

DESCRIPTION OF THE EMBODIMENTS (1) First Embodiment

A description will be given below of a first embodiment, which is an embodiment of the present invention, with reference to the accompanying drawings.

A substrate processing apparatus according to this embodiment is configured as an exemplary semiconductor manufacturing device for use in manufacturing semiconductor devices (Integrated Circuits) (ICs)).

Figure 1:
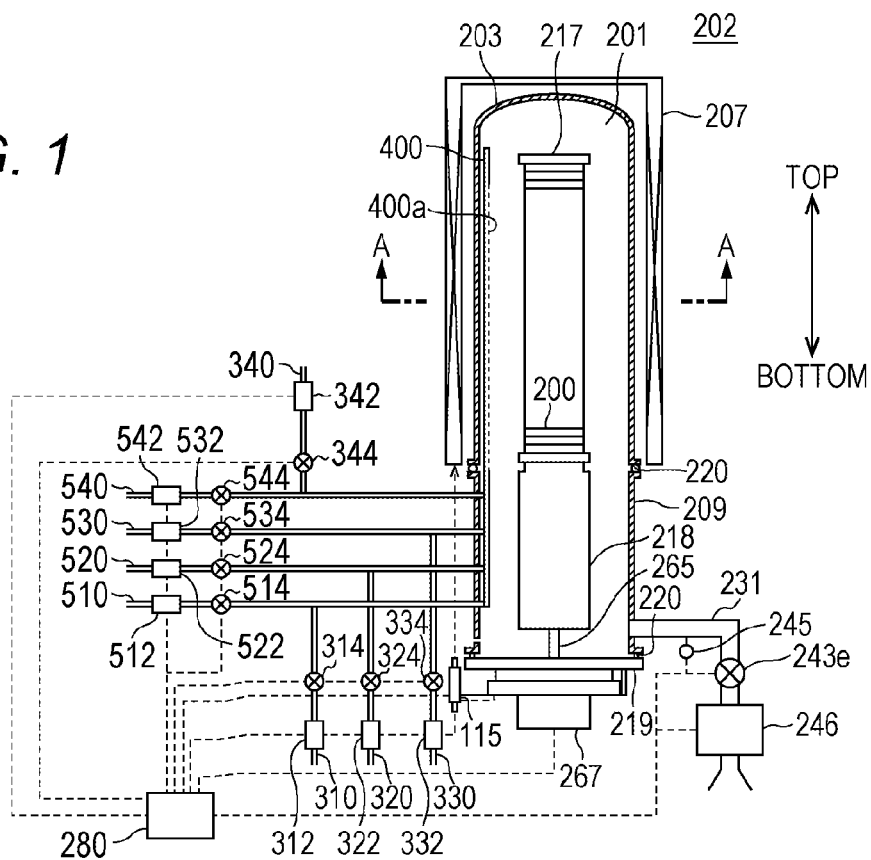
FIG. 1 illustrates a general configuration of a vertical type process furnace for use in a preferred example of the present invention and its associated member, wherein in particular, the process furnace part is illustrated in the vertical section.
Figure 2:
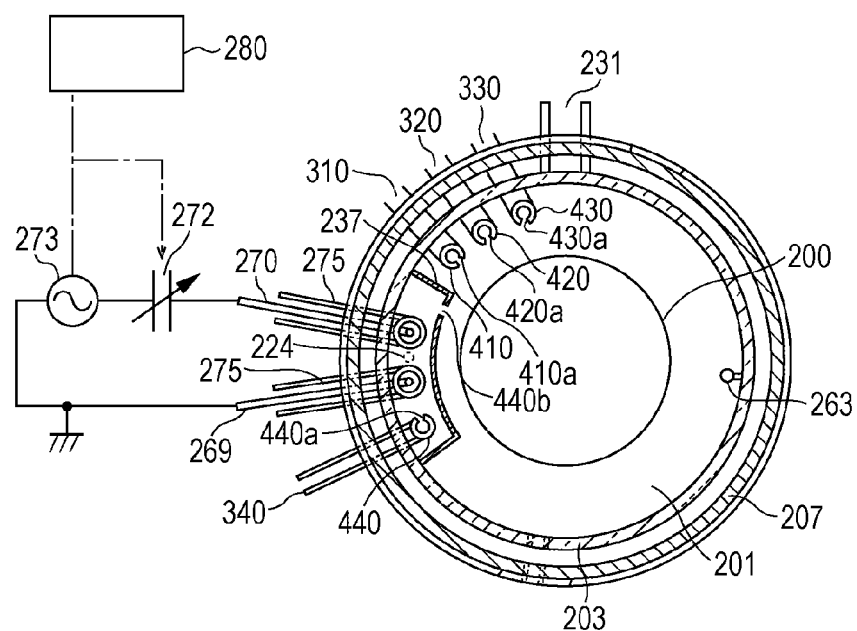
FIG. 2 illustrates a cross section taken along a line A-A of FIG. 1.

As illustrated in FIGS. 1 and 2, a process furnace 202 is provided with a heater 207 that serves as a heating means (heating mechanism or system) that heats wafers 200. The heater 207 includes: a cylindrical heat insulating member with its upper part closed; and a plurality of heater element wires, and configures a unit in which the heater element wires are provided for the heat insulating member. A reaction tube 203 that forms a reaction container (process container) concentrically with the heater 207 is disposed inside the heater 207. The reaction tube 203 is made of a heat-resistant material, such as quartz ($SiO_2$) or silicon carbide (SiC), and is formed in a cylindrical shape with its upper end closed and its lower end opened.

A manifold 209, for example, made of a stainless steel, is provided at the lower end of the reaction tube 203, with an O-ring 220, made of a hermetic member, sandwiched between the manifold 209 and the reaction tube 203. The manifold 209 has an opening at its lower end; this opening is hermetically closed by a seal cap 219 as a lid, with another O-ring 220 sandwiched between the manifold 209 and the seal cap 219. In the process furnace 202, at least the reaction tube 203, the manifold 209 and the seal cap 219 form a process chamber 201.

The seal cap 219 is provided with a boat support base 218; the boat support base 218 supports a boat 217 that serves as a substrate support member as a substrate support means (substrate support tool). The boat 217 holds the plurality of wafers 200. The plurality of wafers 200 is held by the boat 217 while being kept in a lateral position and arranged at fixed spacings. A boat elevator 115, which serves as a transfer unit (transfer mechanism), enables the boat 217 to move vertically with respect to the reaction tube 203 (or enter into or escape from the reaction tube 203). A boat rotation mechanism 267 is provided at the lower end of the boat support base 218 supporting the boat 217; the boat support base 218 rotates the boat 217 in order to improve process uniformity. The driving of the boat rotation mechanism 267 makes it possible to rotate the boat 217 supported by the boat support base 218.

In the process furnace 202 configured above, the plurality of wafers 200 that is subjected to batch processing are laminated in stages vertically on the boat 217. The boat 217 is inserted into the process chamber 201 while being supported by the boat support body 218, and then the wafers 200 inserted into the process chamber 201 are heated to a predetermined temperature by the heater 207.

As illustrated in FIGS. 1 and 2, the process chamber 201 is connected to four gas supply pipes 310, 320, 330 and 340 (or a first gas supply pipe 310, a second gas supply pipe 320, a third gas supply pipe 330, and a fourth gas supply pipe 340) through which source gases are supplied.

The gas supply pipe 310 includes a mass flow controller 312 and a valve 314 arranged in this order from the upstream side; the mass flow controller 312 and the valve 314 serve as a flow rate control device (flow rate control unit) and an on-off valve, respectively. An end of the gas supply pipe 310 is coupled to a nozzle 410 (first nozzle 410). The nozzle 410 is formed as a long, L-shaped nozzle. The lateral part of the nozzle 410 is provided so as to penetrate the side wall of the manifold 209. The vertical part thereof is provided so as to rise within the circumferential space between the wafers 200 and the inner wall of the reaction tube 203 in a direction in which the wafers 200 are laminated and along the inner wall of the reaction tube 203 (i.e., so as to rise from one side of the wafer alignment region toward another side thereof). Specifically, the nozzle 410 is provided along the wafer alignment region in which the wafers 200 are arranged and within a region that is created on the outer side of the wafer alignment region and laterally surrounds the wafer alignment region. The nozzle 410 has a side surface provided with many gas supply holes 410a from which the gas is supplied. The aperture areas of the gas supply holes 410a are the same as one another or inclined in size from the lower part to the upper part, and the gas supply holes 410a are arranged at fixed spacings.

The gas supply pipe 310, the mass flow controller 312, the valve 314, and the nozzle 410 (first nozzle) are main components that configure a first gas supply system.

The gas supply pipe 310 is connected to a carrier gas supply pipe 510 through which a carrier gas is supplied. The carrier gas supply pipe 510 includes a mass flow controller 512 and a valve 514. The carrier gas supply pipe 510, the mass flow controller 512, and the valve 514 are main components that configure a first carrier gas supply system (first inert gas supply system).

The gas supply pipe 320 includes a mass flow controller 322 and a valve 324 arranged in this order from the upstream side; the mass flow controller 322 and the valve 324 serve as a flow rate control device (flow rate control unit) and an on-off valve, respectively. An end of the gas supply pipe 320 is coupled to a nozzle 420 (second nozzle). The nozzle 420 is configured as a long, L-shaped nozzle, similar to the nozzle 410. The lateral part of the nozzle 420 is provided so as to penetrate the side wall of the manifold 209. The vertical part thereof is provided so as to rise within the circumferential space between the wafers 200 and the inner wall of the reaction tube 203 in a direction in which the wafers 200 are laminated and along the inner wall of the reaction tube 203 (i.e., so as to rise from one side of the wafer alignment region toward another side thereof). The nozzle 420 has a side surface provided with many gas supply holes 420a from which the gas is supplied. The aperture areas of the gas supply holes 420a are the same as one another or inclined in size from the lower part to the upper part, similar to the gas supply holes 410a; the gas supply holes 420a are arranged at fixed spacings.

The gas supply pipe 320, the mass flow controller 322, the valve 324, and the nozzle 420 are main components that configure a second gas supply system.

The gas supply pipe 320 is connected to a carrier gas supply pipe 520 through which a carrier gas is supplied. The carrier gas supply pipe 520 includes a mass flow controller 522 and a valve 524. The carrier gas supply pipe 520, the mass flow controller 522, and the valve 524 are main components that configure a second carrier gas supply system (second inert gas supply system).

The gas supply pipe 330 includes a mass flow controller 332 and a valve 334 arranged in this order from the upstream side; the mass flow controller 332 and the valve 334 serve as a flow rate control device (flow rate control unit) and an on-off valve, respectively. An end of the gas supply pipe 330 is coupled to a nozzle 430. The nozzle 430 is configured as a long, L-shaped nozzle, similar to the nozzle 410. The lateral part of the nozzle 430 is provided so as to penetrate the side wall of the manifold 209. The vertical part thereof is provided so as to rise within the circumferential space between the wafers 200 and the inner wall of the reaction tube 203 in a direction in which the wafers 200 are laminated and along the inner wall of the reaction tube 203 (i.e., so as to rise from one side of the wafer alignment region toward another side thereof). The nozzle 430 has a side surface provided with many gas supply holes 430a from which the gas is supplied. The aperture area of the gas supply holes 430a are the same as one another or inclined in size from the lower part to the upper part, similar to the gas supply holes 410a; the gas supply holes 430a are arranged at fixed spacings.

The gas supply pipe 330, the mass flow controller 332, the valve 334, and the nozzle 430 (third nozzle) are main components that configure a third gas supply system.

The gas supply pipe 330 is connected to a carrier gas supply pipe 530 through which a carrier gas is supplied. The carrier gas supply pipe 530 includes a mass flow controller 532 and a valve 534. The carrier gas supply pipe 530, the mass flow controller 532, and the valve 534 are main components that configure a third carrier gas supply system (inert gas supply system).

The gas supply pipe 340 includes a mass flow controller 342 and a valve 344 arranged in this order from the upstream side; the mass flow controller 342 and the valve 344 serve as a flow rate control device (flow rate control unit) and an on-off valve, respectively. An end of the gas supply pipe 340 is coupled to a nozzle 440. The gas supply pipe 340, the mass flow controller 342, the valve 344, and the nozzle 440 (fourth nozzle) are main components that configure a fourth gas supply system.

The gas supply pipe 340 is connected to a carrier gas supply pipe 540 through which a carrier gas is supplied. The carrier gas supply pipe 540 includes a mass flow controller 542 and a valve 544. The carrier gas supply pipe 540, the mass flow controller 542, and the valve 544 are main components that configure a fourth carrier gas supply system (inert gas supply system).

The circumferential space between the wafers 200 and the inner wall of the reaction tube 203, which configures the process chamber 201, is provided with a buffer chamber 237; the buffer chamber 237 serves as a gas dispersion space, and is formed between the upper and lower parts of the inner wall of the reaction tube 203 and in the direction along which the wafers 200 are laminated. The buffer chamber 237 is formed of a buffer chamber wall 247 and the inner wall of the reaction tube 203. Gas supply hole 440b that serve as gas supply holes are provided on the end of the wall which is adjacent to the wafers 200 of the buffer chamber wall 247. The gas supply hole 440b is opened toward the center of the reaction tube 203. The aperture areas of the gas supply hole 440b formed from the upper part to the lower part are the same as one another; the gas supply hole 440b are arranged at fixed spacings.

The nozzle 440 is formed on the side of the buffer chamber 237 opposite the gas supply hole 440b. More specifically, the nozzle 440 is provided from the upper part to the lower part of the reaction tube 203 in the direction along which the wafers 200 are laminated. The nozzle 440 that serves as a supply hole from which a plurality of gases is supplied is provided with gas supply holes 440a. When the difference in inner pressure between the buffer chamber 237 and the process chamber 201 is set small, it is preferable that the aperture area of each gas supply holes 440a or the spacing between the adjacent gas supply holes 440a be uniform from the upstream to downstream of the gases. If the difference in inner pressure between the buffer chamber 237 and the process chamber 201 is set large, it is preferable that the aperture area of each gas supply holes 440a or the spacing between the adjacent gas supply holes 440a increase from the upstream toward downstream of the gases.

In this embodiment, the aperture area of each gas supply holes 440a is set to gradually increase from the upstream toward the downstream. This configuration enables the gases to be discharged from the respective gas supply holes 440a to the buffer chamber 237 at difference flow velocities but nearly equal flow rates.

The difference in flow velocity among the particles contained in the gas discharged from each gas supply holes 440a is reduced within the buffer chamber 237, and then the gases are discharged from the gas supply hole 440b to the process chamber 201. Consequently, the gases that are discharged from the respective gas supply holes 440a become a gas flowing at a uniform flow rate and velocity at the time when being discharged from the gas supply hole 440b.

According to the gas supply method in this embodiment described above, gases are transferred through the nozzle 440 in the buffer chamber 237 and the nozzles 410, 420 and 430 arranged within the circumferential, vertically long space defined by the inner wall of the reaction tube 203 and the outer sides of the plurality of wafers 200 laminated on top of each other. Then, the gases are first discharged to the interior of the reaction tube 203 from the gas supply hole 440b in the buffer chamber and the gas supply holes 410a, 420b and 430c in the nozzles 410, 420 and 430, respectively, in the vicinity of the wafers 200. Further, the main flow of the gases inside the reaction tube 203 is created parallel to the surfaces of the wafers 200, or in the lateral direction. This configuration is effective in forming a thin film having a uniform film thickness on each wafer 200 by supplying uniformly a gas thereto. After the reaction, the remaining gas flows toward an outlet, or an exhaust pipe 231. However, this remaining gas does not necessarily have to flow laterally, and its flow direction may be determined as appropriate, depending on the location of the outlet.

According to an exemplary configuration, from the gas supply pipe 310, hexachlorodisilane (HCDS, $Si_2C_6$) is supplied to the process chamber 201 through the mass flow controller 312, the valve 314 and the nozzle 410. Here, the hexachlorodisilane (HCDS, $Si_2C_6$) is a Si-containing source containing silicon (Si), and used as a source gas that serves as a first element-containing first process gas. When $Si_2C_6$ or some other liquid material that assumes a liquid state at normal temperatures and normal pressures is used, it may be vaporized by a vaporization system, such as a carburetor or bubbler. Specifically, when $Si_2C_6$ is used as the Si-containing source, $Si_2C_6$ is vaporized by a vaporization system such as a carburetor or bubbler, and then supplied to the process chamber 201 as a $Si_2C_6$ gas that serves as a Si-containing gas.

Moreover, from the gas supply pipe 320, $H_2O$ is supplied to the process chamber 201 through the mass flow controller 320, the valve 324 and the nozzle 420. Here, $H_2O$ is an example of a first O-containing gas (oxidation source) containing oxygen (O), and used as a reactive gas that serves as a second element-containing second process gas. In addition, from the gas supply pipe 330, pyridine ($C_5H_5N$) that is an example of a catalyst source is supplied as a catalyst. From the gas supply pipe 340, $O_2$ that is an example of a second O-containing gas that contains oxygen (O) is supplied as a third element-containing third process gas.

For example, in the case where gases as described above flow through the respective gas supply pipes, the first gas supply system configures a source gas supply system. This source gas supply system is also referred to as a Si-containing gas supply system (Si-containing source supply system). Likewise, the second, third and fourth gas supply systems configure a first O-containing gas supply system (first oxidation source supply system), a catalyst supply system (catalyst source supply system), and the second O-containing gas supply system (second oxidation source supply system), respectively. Assuming the Si-containing gas is referred to as the first process gas, the Si-containing gas supply system configures the first process gas supply system. Assuming the first O-containing gas is referred to as a second process gas, the first O-containing gas supply system configures the second process gas supply system. Assuming the second O-containing gas is referred to as the third process gas, the second O-containing gas supply system configures the third process gas supply system. The source gas supply system and the first and second O-containing gas supply systems are also referred to as simply a Si-containing source supply system and first and second oxidation source supply systems, respectively. In addition, the first O-containing gas may also be referred to as a reactive gas, because it reacts with the source gas. In this case, the first and second O-containing gas supply systems are referred to as first and second reactive gas supply systems, respectively.

In the buffer chamber 237, a first bar-shaped electrode 269 and a second bar-shaped electrode 270 are disposed while being entirely protected by electrode protective tubes 275. Here, a first bar-shaped electrode 269 and a second bar-shaped electrode 270 serve as first and second electrodes, respectively, with a long, thin structure; the electrode protective tubes 275 each serve as a protective tube. One of the first bar-shaped electrode 269 and the second bar-shaped electrode 270 is connected to a high frequency (Radio Frequency: RF) power source 273 through a matching box 272, whereas the other thereof is connected to the reference potential, or is grounded. As a result, plasma is generated within a plasma generating region 224 defined between the first bar-shaped electrode 269 and the second bar-shaped electrode 270.

The electrode protective tubes 275 are structured to be insertable into the buffer chamber 237 while separating both the first bar-shaped electrode 269 and the second bar-shaped electrode 270 from the air in the buffer chamber 237. When the air in the electrode protective tubes 275 is identical to external air (atmospheric air), the first bar-shaped electrode 269 and the second bar-shaped electrode 270 that are respectively inserted into the electrode protective tube 275 are prone to being oxidized by heat emitted from the heater 207. For this reason, an inert gas purge mechanism is provided inside each electrode protective tube 275. Specifically, this inert gas purge mechanism is used to sufficiently reduce the concentration of oxygen in each electrode protective tube 275 by filling the interior of each electrode protective tube 275 with an inert gas, such as nitrogen, or discharging an inert gas thereto. In this way, the oxidation of both the first bar-shaped electrode 269 and the second bar-shaped electrode 270 can be prevented. The first bar-shaped electrode 269, the second bar-shaped electrode 270, the electrode protective tubes 275, the buffer chamber 237 and the gas supply hole 440b are main components that configure the plasma generating mechanism (plasma producing mechanism). The plasma generating mechanism functions as an activation mechanism that activates the gas by using plasma; the buffer chamber 237 also functions as a plasma generating chamber (plasma producing chamber). Both the matching box 272 and the high frequency power source 273 may be included in the plasma generating mechanism.

In this embodiment, generated plasma is referred to as remote plasma. This remote plasma is transferred to a workpiece surface to be processed, for example, with a gas flow after being generated between the electrodes, and used to subject the workpiece surface to a plasma treatment. This embodiment employs the configuration in which the two bar-shaped electrodes 269 and 270 are accommodated in the buffer chamber 237. This prevents the ions that risk damaging the wafers 200 from being easily leaked into the process chamber 201 provided outside the buffer chamber 237. In addition, an electric field is generated so as to surround the two bar-shaped electrodes 269 and 270 (i.e., so as to surround the electrode protective tubes 275 containing the two bar-shaped electrodes 269 and 270), and then plasma is generated there. An electric field is generated so as to surround the two bar-shaped electrodes 269 and 270 (i.e., so as to surround the electrode protective tubes 275 in the two bar-shaped electrodes 269 and 270), and then plasma is generated there. Furthermore, the activated species accommodated in the plasma are supplied to the wafers 200 in the direction from its circumference to its center through the gas supply hole 440b in the buffer chamber 237. In this case, a vertical batch device, as in this embodiment, in which the plurality of wafers 200 is laminated with their principal surfaces parallel to the lateral surface is effective, because since the buffer chamber 437 is positioned close to the inner wall surface of the reaction tube 203, namely, close to the wafers 200 to be processed, the generated activated species can easily reach the surfaces of the wafers 200 without being made inactive.

The process chamber 201 is connected to the exhaust pipe 231 through which the air in the process chamber 201 is exhausted to the outside. In a laterally planar view as in FIG. 2, the exhaust pipe 231 is provided on the opposite side of the gas supply holes 410a in the nozzle 410, the gas supply holes 420a in the nozzle 420, the gas supply holes 430a in the nozzle 430, and the gas supply hole 440b in the buffer chamber 237 which are arranged within the reaction tube 203, namely, opposite the gas supply holes 410a, 420a, 430a and 440b with the wafers 200 therebetween. In addition, in a vertically planar view as in FIG. 1, the exhaust pipe 231 is provided below the gas supply holes 410a, 420a, 430a and 440b. With this configuration, when the gases supplied from the gas supply holes 410a, 420a, 430a and 440b to the space created adjacent to the wafers 200 within the process chamber 201, they flow laterally, namely, parallel to the surfaces of the wafers 200, then flow downward, and is exhausted to the output through the exhaust pipe 231. The gases inside the process chamber 201 mainly create a lateral flow, as described above.

The exhaust pipe 231 is connected to a vacuum pump 246 through a pressure sensor 245 and an APC (Auto Pressure Controller) valve 243e. Specifically, the vacuum pump 246 serves as a vacuum exhaust device; the pressure sensor 245 detects the inner pressure of the process chamber 201 as a pressure detector (pressure detecting unit); and the APC valve 243e serves as a pressure adjustor (pressure adjusting unit). The vacuum pump 246 is configured to be able to vacuum the process chamber 201, exhausting air therein to the outside so that its inner pressure has a predetermined value (degree of vacuum). The exhaust pipe 231 on the downstream side with respect to the vacuum pump 246 is connected to, such as, an exhaust gas processing device (not illustrated). The APC valve 243e is an on-off valve that can vacuum the process chamber 201, exhausting air therein to the outside or stop vacuuming it by opening/close its valve and adjust the inner pressure of the process chamber 201 by adjusting its aperture or conductance. The exhaust pipe 231, the APC valve 243e and the pressure sensor 245 are main components that configure an exhaust system or exhaust line. The vacuum pump 246 can be considered to be included in the exhaust system; a trap device and abatement device can also be considered to be included in the exhaust system.

A temperature sensor 263 is disposed inside the reaction tube 203 as a temperature sensor; the power supplied to the heater 207 is adjusted on the basis of the temperature information detected by the temperature sensor 263 so that the inner temperature of the process chamber 201 exhibits a desired distribution. The temperature sensor 263 is configured into an L shape; and the temperature sensor 263 is introduced to the interior of the manifold 209 by penetrating the manifold 209, and provided along the inner wall of the reaction tube 203.

Figure 3:
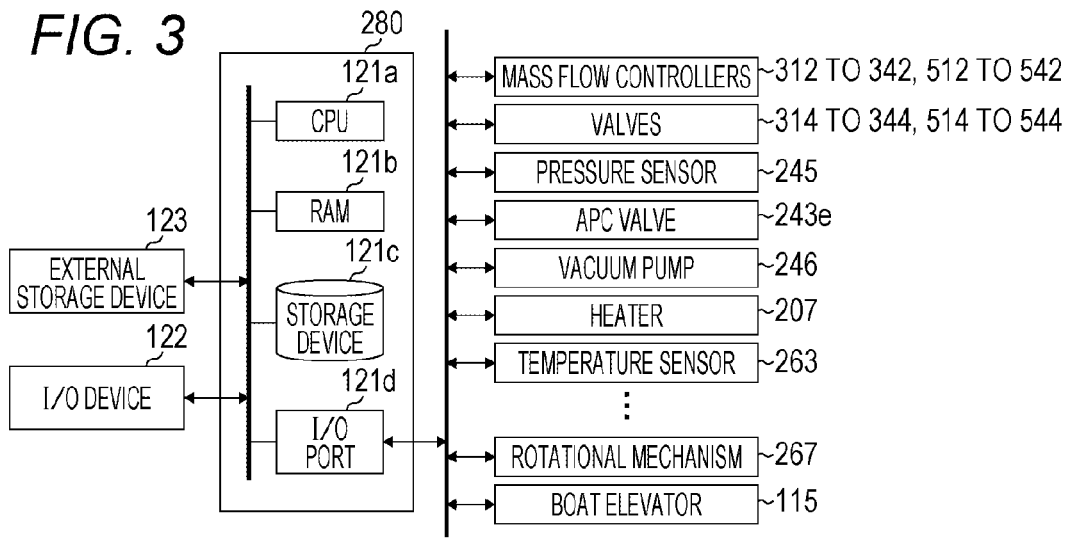
FIG. 3 is a block diagram illustrating a general configuration of a controller in a substrate processing apparatus 10 in FIG. 1.
Figure 4:
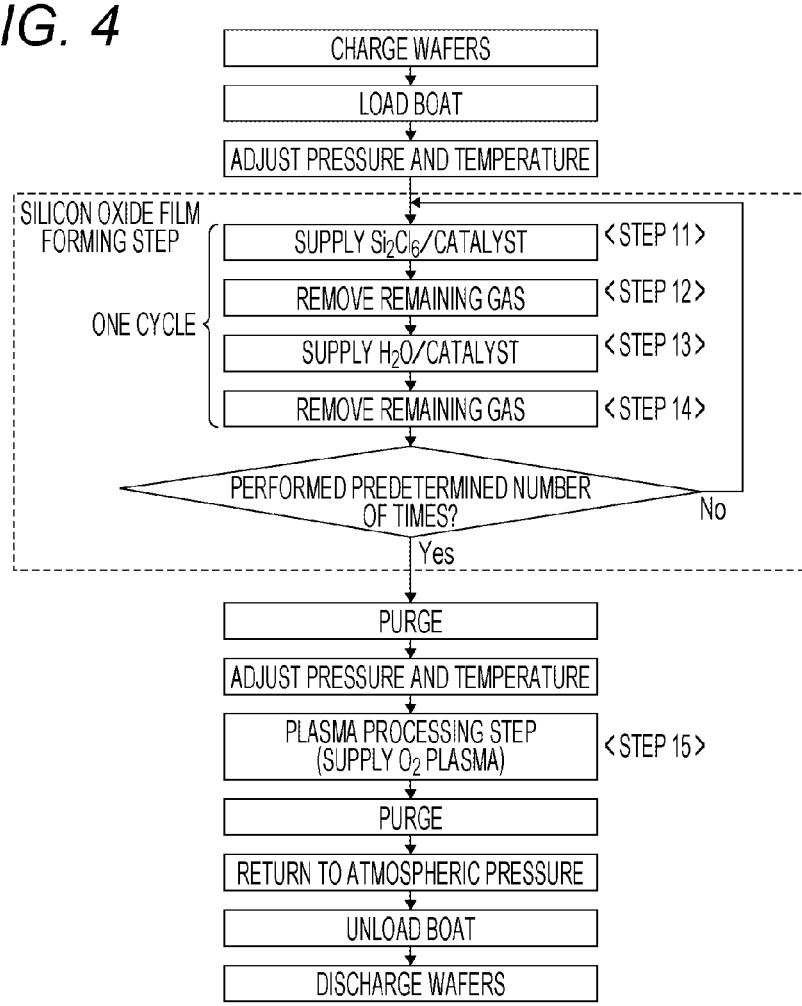
FIG. 4 is an explanatory flowchart of a process of forming a silicon oxide film in a first embodiment of the present invention.
Figure 5:
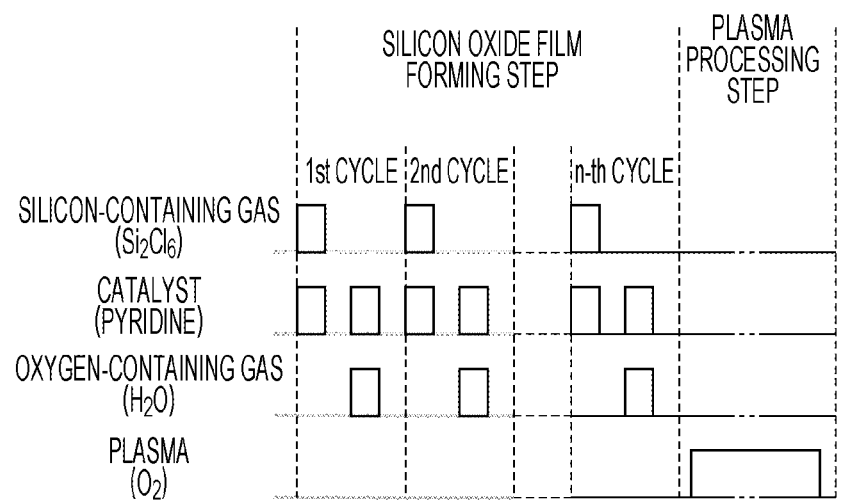
FIG. 5 is an explanatory main gas supply sequence of the process of forming a silicon oxide film in the first embodiment of the present invention.

As illustrated in FIG. 3, a controller 280 is illustrated. As illustrated in FIG. 3, the controller 280 is formed of a computer that includes a Central Processing Unit (CPU) 121a, a Random Access Memory (RAM) 121b, a storage device 121c, and an I/O port 121d. The RAM 121b, the storage device 121c and the I/O port 121d are configured to be able to exchange data with the CPU 121a via an internal bus (not illustrated). The controller 280 is connected to an I/O device 122, such as, configured as a touch panel.

The storage device 121c is formed of, such as, a flash memory or a Hard Disk Drive (HDD). The storage device 121c stores, in a readable manner, a control program used to control the operation of a substrate processing apparatus, a process recipe in which the sequence and condition of a process for a substrate which will be described below are described, and the like. The process recipe is created so as to be able to provide a predetermined result by causing the controller 280 to execute procedures in a substrate processing step that will be described below. Thus, the process recipe functions as a program. The process recipe, the control program and the like are referred to below as simply programs. When the word "program" is used herein, there are cases where it implies only a process recipe, only a control program, or both of these. The RAM 121b is configured as a memory region (work area) in which a program, data and the like read by the CPU 121a are temporarily held.

The I/O port 121d is connected to the above mass flow controllers 312, 322, 332, 342, 512, 522, 532 and 542, the valves 314, 324, 334, 344, 514, 524, 534 and 544, the pressure sensor 245, the APC valve 243e, the vacuum pump 246, the heater 207, the temperature sensor 263, a rotation mechanism 267, the boat elevator 115, and the like.

The CPU 121a is configured to read the control program from the storage device 121c and execute the control program, and to read the process recipe from the storage device 121c, for example, in response to the input of an operation command from the I/O device 122. Then, the CPU 121a is configured to perform the following controls in conformity with the content of the read process recipe: for example, the operations of adjusting the flow rates of the various gases which are performed the mass flow controllers 312, 322, 332, 342, 512, 522, 532 and 542; the open/close operations of the valves 314, 324, 334, 344, 514, 524, 534 and 544; the open/close operation of the APC valve 243e; the operation of adjusting the pressure which is performed by the APC valve 243e on the basis of the pressure sensor 245; the operation of adjusting the temperature by using the heater 207 on the basis of the temperature sensor 263; the activation/halt of the vacuum pump 246; the rotation of the boat 217 which is made by the rotational mechanism 267; the operation of adjusting the rotational speed of the boat 217 which is performed by the rotational mechanism 267; and the operation of elevating the boat 217 which is performed by the boat elevator 115.

The controller 280 does not necessarily have to be configured as a dedicated computer; alternatively the controller 280 may be configured as a general-purpose computer. For example, the controller 280 in this embodiment may be configured as follows; an external storage device 123 (e.g., a magnetic disk such as a magnetic tape, a flexible disk or a hard disk, an optical disc such as a CD or a DVD, a magneto-optical disc such as an MO, or a semiconductor memory such as a USB memory or a memory card) is prepared, and then programs are installed in a general-purpose computer using the external storage device 123. The method of supplying programs to the computer is not limited to that of supplying them through the external storage device 123. Alternatively, for example, programs may be supplied using a communication means, such as the Internet or a dedicated line, without using the external storage device 123. The storage device 121c and the external storage device 123 may each be configured as a non-transitory computer-readable recording medium. These are also referred to below as a recording medium. When the word "non-transitory computer-readable recording medium" is used herein, there are cases where it implies only the storage device 121c, only the external storage device 123, or both of these.

Next, a description will be given of an exemplary application of the present invention to the manufacture of a Large Scale Integration (LSI), which is an exemplary method of manufacturing a semiconductor device (semiconductor device). More specifically, a description will be given of an example of forming a silicon oxide film ($SiO_2$ film) (also referred to as a silicon oxide (SiO) film) on a substrate at a low temperature. In some cases, for example, a resist pattern or the like made of a resin photoresist material is formed on the substrate. In the following description, the controller 280 controls the operations of individual units configuring the substrate processing apparatus.

In this embodiment, first a silicon oxide film-forming step at which a silicon oxide film is formed on a substrate is performed. Then, a post-processing step at which the formed silicon oxide film is subjected to a post-process is performed. At the post-processing step, only a heat treatment, only a plasma treatment, or both of the heat and plasma treatments may be performed. The heat treatment is also referred to as an annealing treatment.

When the word "wafer" is used herein, there are cases where it implies simply a "wafer itself" or a "laminated body (assembly) including a wafer and a predetermined layer or film or the like formed on the surface of the wafer (i.e., a wafer, a predetermined layer or film and the like formed on the surface of the wafer are collectively referred to as a wafer). Furthermore, when the expression "the surface of a wafer" is used herein, there are cases where it implies "the (exposed) surface of the wafer" or "the surface of a predetermined layer or film or the like formed on the wafer," namely, "the uppermost surface of the wafer as a laminated body."

Accordingly, when the expression "supply a predetermined gas to a wafer" is given herein, it implies "directly supply a predetermined gas to the (exposed) surface of a wafer itself" or "supply a predetermined gas to a layer, a film or the like on the wafer, namely, the uppermost surface of a wafer as a laminated body. When the expression "form a predetermined layer (or film) on a wafer," is given herein, there is a case where it implies "directly form a predetermined layer (or film) on the (exposed) surface of a wafer" or "form a predetermined layer (or film) on a layer, a film or the like formed on a wafer, namely, the uppermost surface of a wafer as a laminated body."

When the word "substrate" is used herein, it implies the same meaning as the case where the word "wafer" is used, in which case the word "wafer" may be regarded as the replacement of the word "substrate" in the above description.

[Silicon Oxide Film-Forming Step]

At the silicon oxide film-forming step, a silicon oxide film is formed on each wafer 200 or a resist pattern or hard mask (not illustrated) formed thereon. In this step, at least two source gases, which are sources contributing to the formation of a film, are alternately supplied to each substrate under a certain film forming condition (temperature, pressure, time, and the like). In this way, a layer is formed on each substrate, and the film-forming is completed.

Then, a description will be given regarding the following case, with reference to FIGS. 4, 5, 6, 7A and 7B. Silicon (Si) is used as the first element; oxygen (O) is used as the second and third elements. A $Si_2Cl_6$ gas is used as the first element-containing first process gas, and is obtained by vaporizing a liquid source $Si_2Cl_6$, which is a Si-containing source, with the vaporization system such as a carburetor or bubbler. An $H_2O$ gas, which is an O-containing gas, is used as the second element-containing second process gas. Pyridine is used as the catalyst. An $N_2$ gas is used as the carrier gas. An $O_2$ gas, which is an O-containing gas, is used as the third element-containing third process gas.

The heater 207 is controlled in such a way that the interior of the process chamber 201 is maintained at a temperature lower than the degradation temperature of the resist film. Specifically, this temperature may be a predetermined temperature in the range from room temperature to 200° C., preferably from room temperature to 150° C., and more preferably from room temperature to 100° C. For example, this temperature is 65° C. to 90° C. In this case, the interior of the process chamber 201 is maintained at 65° C. Then, the plurality of wafers 200 is loaded into the boat 217, and the boat 217 is carried into the interior of the process chamber 201. Subsequently, the boat 217 is rotated together with the wafers 200 by the boat drive mechanism 267. Followed by, the vacuum pump 246 is actuated, and the valve 243e is opened, so that the process chamber 201 is vacuumed. When the temperature of the wafers 200 reaches 65° C. and then this temperature and the like become stable, the following four steps are sequentially performed while the inner temperature of the process chamber 201 is maintained at 65° C.

(Step 11)

While the $Si_2Cl_6$ gas, $H_2O$ and pyridine are being introduced to (made to flow into) the gas supply pipes 310, 320 and 330, respectively and $N_2$ gas is being introduced to (made to flow into) the carrier gas supply pipes 510, 520, 530 and 540, the valves 314, 334, 514, 524, 534 and 544 are opened at an appropriate timing. Meanwhile, the valves 324 and 344 are kept closed.

As a result of the above, the $Si_2Cl_6$ gas passes through the gas supply pipe 310 and flows to the nozzle 410 while being mixed with the $N_2$ gas. Then, the $Si_2Cl_6$ gas is supplied from the gas supply holes 410a to the interior of the process chamber 201. Likewise, the pyridine passes through the gas supply pipe 330 and flows to the nozzle 430 while being mixed with the $N_2$ gas. Then, the pyridine is supplied from the gas supply holes 430a to the interior of the process chamber 201. Furthermore, the $N_2$ gas passes through the carrier gas supply pipes 520 and 540, and flows to the nozzle 420. Then, the $N_2$ gas is supplied from the gas supply holes 420a and 440b to the interior of the process chamber 201. When the $Si_2Cl_6$ gas and the pyridine are supplied to the interior of the process chamber 201, they pass over the surfaces of the wafers 200, and are exhausted to the outside through the exhaust pipe 231.

Figure 7A:
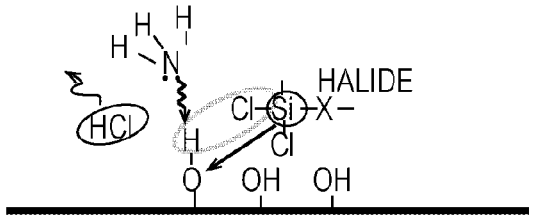
FIGS. 7A and 7B illustrate a film-forming model of forming the silicon oxide film in the second and third embodiments of the present invention.

At Step 11, both the valves 314 and 334 are controlled in such a way that the time period over which both the $Si_2Cl_6$ gas and the pyridine are supplied is set from 1 second to 100 seconds, and preferably from 5 seconds to 30 seconds. In addition, both the valves 314 and 334 are also controlled in such a way that the supply flow rate ratio of the $Si_2Cl_6$ gas and the pyridine is set from 0.01 to 100 and preferably 0.05 to 10. Here, this supply flow rate ratio is expressed by $Si_2Cl_6$ gas (sccm)/pyridine (sccm). Simultaneously, the valve 243e is adjusted appropriately in such a way that the inner pressure of the process chamber 201 is set to an optimum value (e.g., 10 Torr) falling within any given range. At Step 11 described above, supplying both the $Si_2Cl_6$ gas and the pyridine to the interior of the process chamber 201 forms the Si-containing layer on the wafer 200 or the resist pattern or hard mask (not illustrated) formed thereon. As a result of Step 11 described above in which both the $Si_2Cl_6$ gas and the pyridine are supplied to the interior of the process chamber 201, the pyridine reacts with OH bonds formed on each wafer 200 or the like, pulling H, as illustrated in FIG. 7A. Therefore, the OH bonding force decreases, and the Cl of $Si_2Cl_6$ molecule reacts with H. As a result, HCl is removed and the intermediate (halide) is left on each wafer 200.

(Step 12)

Both the valves 314 and 334 are closed, and then the supply of the $Si_2Cl_6$ gas and the pyridine is stopped. Meanwhile, the $N_2$ gas is continuously supplied from the carrier gas supply pipes 510, 520, 530 and 540 to the interior of the process chamber 201, whereby the $N_2$ gas purges the interior of in the process chamber 201. For example, the purging time period is set to 15 seconds. Alternatively, two steps, or purging and vacuuming steps, may be performed within 15 seconds. As a result, the remaining $Si_2Cl_6$ gas and the pyridine are eliminated from the process chamber 201.

In the above case, the whole of the gas remaining in the process chamber 201 does not have to be eliminated, and the interior of the process chamber 201 does not also have to be purged completely. This is because a small amount of the gas remaining in the process chamber 201 does not affect Step 13 that is performed next. Furthermore, the N2 gas does not have to be supplied to the interior of the process chamber 201 at a high flow rate. For example, by supplying the $N_2$ gas by an amount that is substantially the same as the volume of the reaction tube 203 (process chamber 201), the purge can be performed so as not to affect Step 13. By not purging the interior of the process chamber 201 in this manner, the purge time period can be shortened and therefore the throughput can be improved. In addition, the consumption of the $N_2$ gas can be reduced to a requisite minimum.

(Step 13)

While the valves 514, 524, 534 and 544 are kept opened, the valves 324 and 334 are opened at an appropriate timing. Meanwhile, the valves 314 and 344 are kept closed. As a result, the $H_2O$ gas passes through the gas supply pipe 320 and flows to the nozzle 420 while being mixed with the $N_2$ gas. Then, the $H_2O$ gas is supplied from the gas supply holes 420a to the interior of the process chamber 201. Likewise, the pyridine passes through the gas supply pipe 330 and flows to the nozzle 430 while being mixed with the $N_2$ gas. Then, the pyridine is supplied from the gas supply holes 430a to the interior of the process chamber 201. Furthermore, the $N_2$ gas passes through both the carrier gas supply pipes 510 and 540, and flows to both the nozzles 410 and 440, being supplied from the gas supply holes 410a and 440b to the interior of the process chamber 201. When both the $H_2O$ gas and the pyridine are supplied to the interior of the process chamber 201, they pass over the surfaces of the wafers 200, and are exhausted to the outside through the exhaust pipe 231.

Figure 7B:
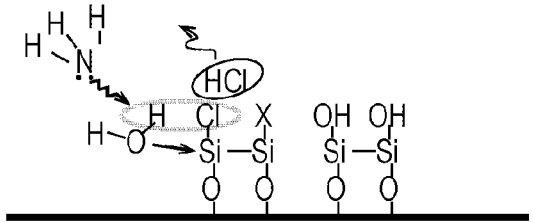

At Step 13, both the valves 324 and 334 are controlled in such a way that the time period over which both the $H_2O$ gas and the pyridine are supplied is set from 1 second to 100 seconds, and preferably from 5 seconds to 30 seconds. In addition, both the valves 324 and 334 are controlled in such a way that the supply flow rate ratio of the $Si_2Cl_6$ gas and the pyridine is set from 0.01 to 100 and preferably 0.05 to 10. Here, the supply flow rate ratio is expressed by $H_2O$ gas (sccm)/pyridine (sccm). Simultaneously, the valve 243e is adjusted appropriately in such a way that the inner pressure of the process chamber 201 is set to an optimum value (e.g., 10 Torr) falling within any given range. At Step 13 described above, both the $H_2O$ gas and the pyridine are supplied to the interior of the process chamber 201, whereby the pyridine reacts with the OH bonds of $H_2O$, as illustrated in FIG. 7B. When the OH bonding force decreases, $H_2O$ reacts with the Si-containing layer formed on each wafer 200 or the like. Then, the Cl contained in the Si-containing layer reacts with OH or O so that HCl is removed; O or OH reacts with Si contained in the Si-containing layer. As a result, the SiO-containing layer containing Si and O is formed on the wafer 200 or the resist pattern or the hard mask (not illustrated) formed thereon. The supply concentrations of the $H_2O$ gas and the pyridine are preferably the same as each other.

A property required for an oxidation source (source corresponding to an $H_2O$ gas) supplied at Step 13 is that each molecule contains an atom having high electronegativity and is electrically biased. A reason is that such an oxidation source decreases the activation energy of a source gas due to the high electronegativity of pyridine, facilitating the reaction. In the light of the above reason, $H_2O$ or $H_2O_2$ having an OH bond is preferred for the source gas supplied at Step 13, but a nonpolar molecule, such as $O_2$ or $O_3$, is not preferred.

(Step 14)

Both the valves 324 and 334 are closed, and then the supply of the $H_2O$ gas and the pyridine is stopped. Meanwhile, the $N_2$ gas is continuously supplied from the carrier gas supply pipes 510, 520 and 530 to the interior of the process chamber 201, whereby the $N_2$ gas purges the interior of the process chamber 201. For example, the purge time period is set to 15 seconds. Alternatively, two steps, or the purging and vacuuming steps, may be performed within 15 seconds. As a result, the remaining $H_2O$ gas and the pyridine are eliminated from the process chamber 201.

In the above case, the whole of the gas remaining in the process chamber 201 does not have to be eliminated, and the interior of in the process chamber 201 does not also have to be purged. This is because a small amount of gas remaining in the process chamber 201 does not affect Step 11 that is performed next. Furthermore, the $N_2$ gas does not have to be supplied to the interior of the process chamber 201 at a high flow rate. For example, by supplying the N2 gas by an amount that is substantially the same as the volume of the reaction tube 203 (process chamber 201), the purge can be performed so as not to affect Step 13. By not purging the interior of in the process chamber 201 in this manner, the purge time period can be shortened and therefore the throughput can be improved. In addition, the consumption of the $N_2$ gas can be reduced to a requisite minimum.

After that, Steps 11 to 14 are performed as one cycle, and this cycle is repeated multiple times. As a result of this, a SiO film having a predetermined film thickness is formed on each wafer 200 or the resist pattern or hard mask (not illustrated) formed thereon.

Next, in order to remove moisture from the SiO film formed in the above manner, a post-process will be performed. A heat treatment and/or a plasma treatment may be performed as the post-process. More specifically, only a heat treatment, only a plasma treatment, or both of these may be performed.

(1) First Embodiment

In a first embodiment, only a plasma treatment using $O_2$ gas is performed as an exemplary post-process. This exemplary post-process will be described.

[Post-Processing Step (Plasma Treatment Step)]

After the silicon oxide film is formed on each substrate at the silicon oxide film-forming step, a plasma treatment step will be performed. The interior of the process chamber 201 is vacuumed so that $Si_2Cl_6$, $H_2O$ and the pyridine remaining therein are exhausted to the outside (purged).

(Step 35)

Next, the heating by the heater 207 is stopped, whereby the interior of the process chamber 201 is naturally cooled until the inner temperature becomes lower than that in the film-forming process. Simultaneously with the cooling, an $O_2$ gas is continuously supplied to the interior of the process chamber 201. Specifically, the plasma treatment is performed at a temperature lower than that in the film-forming process while the interior of the process chamber 201 is being purged using the $O_2$ gas. For example, the inner temperature of the process chamber 201 is decreased to 40° C. When the $O_2$ gas is supplied to the interior of the buffer chamber 237, the $O_2$ gas is excited by the plasma. Therefore, the plasma treatment is performed in the activated $O_2$ gas atmosphere. More specifically, while the inner temperature of the process chamber 201 is being naturally cooled, the $O_2$ gas is supplied to the interior of the gas supply pipe 340 and $N_2$ gas is supplied to the carrier gas supply pipes 510, 520, 530 and 540. Then, the valves 344, 514, 524, 534 and 544 are opened. As a result, the $O_2$ gas passes through the gas supply pipe 340, then flows to the nozzle 440, and is supplied from the gas supply holes 440a to the interior of the buffer chamber 237. In addition, the high frequency power source 273 applies a high-frequency power between the bar-shaped electrodes 269 and 270 through the matching box 272. In response, the $O_2$ gas that is supplied to the interior of the buffer chamber 23 is excited (i.e., activated) by the plasma. Then, the activated $O_2$ gas is supplied from the gas supply holes 440b to the interior of the process chamber 201, and exhausted from the exhaust pipe 231 to the outside.

(2) Second Embodiment

In a second embodiment, both heat and plasma treatments using an $O_2$ gas are performed simultaneously as an exemplary post-processing step. This exemplary post-process will be described. A silicon oxide film-forming step in this embodiment (Steps 21 to 24) is performed in the same manner as the first embodiment (Steps 11 to 14). In the above first embodiment, the inner temperature of the process chamber 201 is set to 65° C. at the silicon oxide film-forming step. However, when the heat treatment is performed as the post-processing step, the film forming temperature may be set to a higher temperature such as 100° C. Moreover, the apparatus configuration in this embodiment is the same as that in the first embodiment. Parts that are the same as those in the first embodiment will not be described.

[Post-Processing Step (Plasma Heat Treatment Step)]

After the silicon oxide film is formed on the substrate at the silicon oxide film-forming step, similar to the first embodiment, both heat and plasma treatments will be performed simultaneously. The process chamber 201 is vacuumed so that $Si_2Cl_6$, $H_2O$ and the pyridine remaining therein are exhausted to the outside (purged). Then, as illustrated in FIG. 6, the inner temperature of the process chamber 201 is increased to 200° C.

(Step 15)

Figure 6:
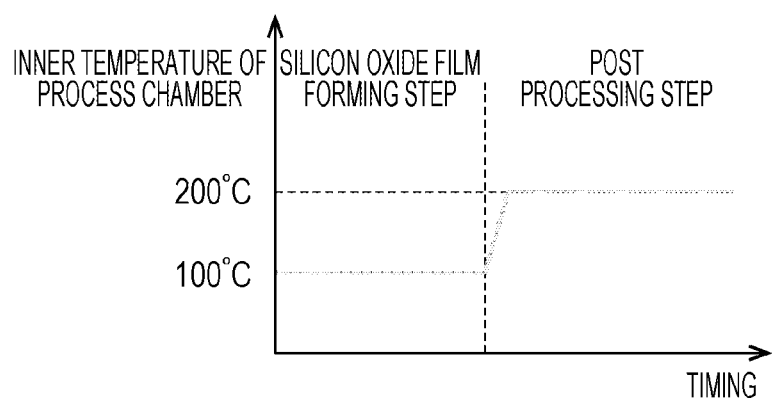
FIG. 6 is an explanatory temperature sequence of processes of forming a silicon oxide film in second and third embodiments of the present invention.

As illustrated in FIG. 6, while the inner temperature of the process chamber 201 is being increased, the $O_2$ gas is being supplied to the interior of the process chamber 201 so that it purges the interior of the process chamber 201. Simultaneously with the purging, a plasma heat treatment is performed at a temperature which is higher than the temperature set in the film-forming process but lower than the degradation temperature of the resist film. When the $O_2$ gas is supplied to the interior of the buffer chamber 237, the $O_2$ gas is excited by the plasma. Therefore, the plasma treatment is performed in the activated $O_2$ gas atmosphere. More specifically, while the $O_2$ gas is being introduced to the interior of the gas supply pipe 340 and the $N_2$ gas is being introduced to the carrier gas supply pipes 510, 520, 530 and 540, the valves 344, 514, 524, 534 and 544 are opened. As a result, the $O_2$ gas passes through the gas supply pipe 340, then flows to the nozzle 440, and is supplied from the gas supply holes 440a to the interior of the buffer chamber 237. In addition, the high frequency power source 273 applies a high-frequency power between the bar-shaped electrodes 269 and 270 through the matching box 272. In response, the $O_2$ gas that is supplied to the interior of the buffer chamber 23 is excited (i.e., activated) by the plasma. Then, the activated $O_2$ gas is supplied from the gas supply holes 440b to the interior of the process chamber 201, and exhausted from the exhaust pipe 231 to the outside.

After that, the process chamber 201 is vacuumed whereby $O_2$ remaining in the process chamber 201 is exhausted to the outside (purged). Then, the valve 243e is controlled in such a way that the inner pressure of the process chamber 201 becomes the atmospheric pressure. Subsequently, the boat 217 is carried out of the process chamber 201. Through the above steps, one cycle of film-forming process and plasma heat treatment (batch processing) is completed.

(2) Third Embodiment

Figure 8:
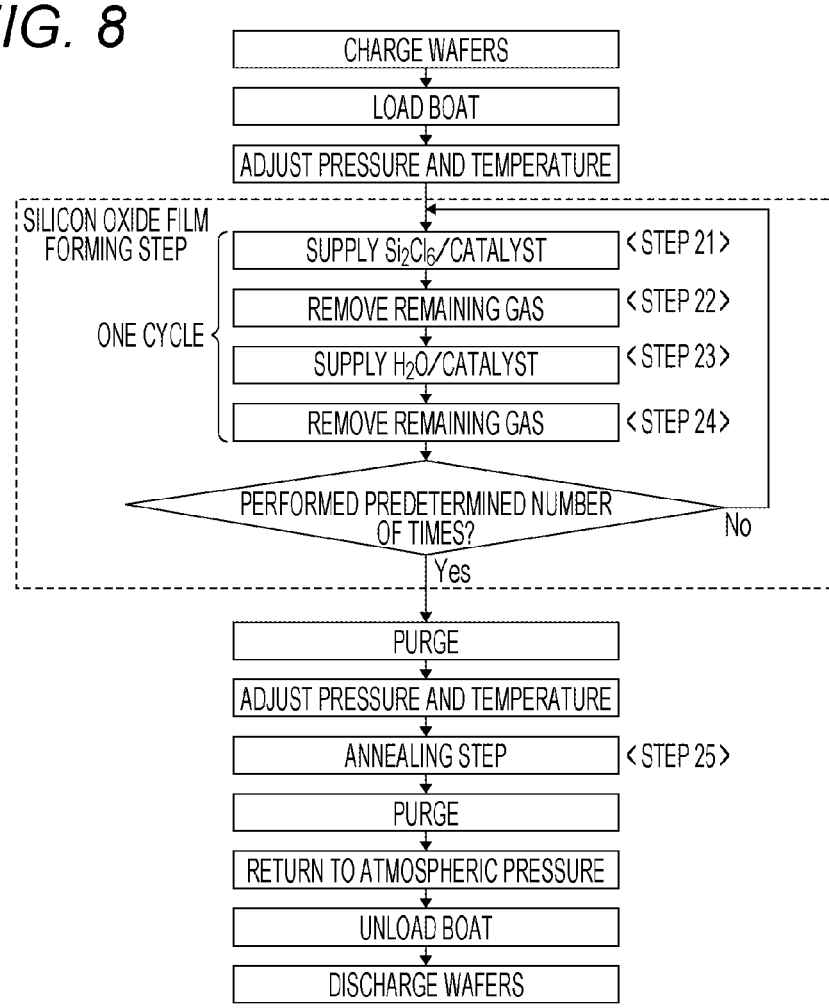
FIG. 8 is an explanatory flowchart of the process of forming a silicon oxide film in the third embodiment of the present invention.
Figure 9:
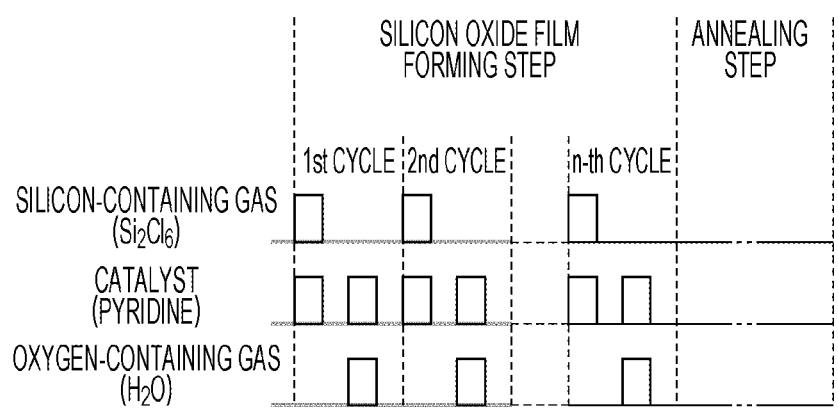
FIG. 9 is an explanatory main gas supply sequence of the process of forming a silicon oxide film in the second embodiment of the present invention.

In a third embodiment, only a heat treatment using $N_2$ is performed without using the plasma excitation as an exemplary post-processing step. This exemplary post-process will be described with reference to FIGS. 6, 8 and 9. The silicon oxide film-forming step in this embodiment (Steps 21 to 24) is performed in the same manner as the second embodiment (Steps 11 to 14). In addition, the apparatus configuration in this embodiment is the same as that in the second embodiment. However, the gas supply system 304, the carrier gas supply system 504, the buffer chamber 237, the first bar-shaped electrode 269, the second bar-shaped electrode 270, the electrode protective tubes 275, the matching box 272, and the high frequency power source 273 may be eliminated. Parts that are the same as those in the first embodiment will not be described.

[Post-Processing Step (Heat Treatment Step)]

After the silicon oxide film is formed on the substrate at the silicon oxide film-forming step, similar to the second embodiment, a heat treatment step will be performed. The process chamber 201 is vacuumed so that $Si_2Cl_6$, $H_2O$ and the pyridine remaining therein are exhausted to the outside (purged). Then, as illustrated in FIG. 6, the inner temperature of the process chamber 201 is increased to 200° C.

(Step 25)

Simultaneously, while $N_2$ is being supplied from the carrier gas supply pipes 510, 520, 530 and 540 (if provided) to the interior of the process chamber 201 and the interior of the process chamber 201 is being purged with $N_2$, the heat treatment is performed at 200° C.

After that, the process chamber 201 is vacuumed whereby $N_2$ remaining in the process chamber 201 is exhausted to the outside (purged). Then, the valve 243e is controlled in such a way that the inner pressure of the process chamber 201 becomes the atmospheric pressure. Subsequently, the boat 217 is carried out of the process chamber 201. Through the above steps, one cycle of film-forming process and plasma heat treatment (batch processing) in the second embodiment is completed.

Figure 10:
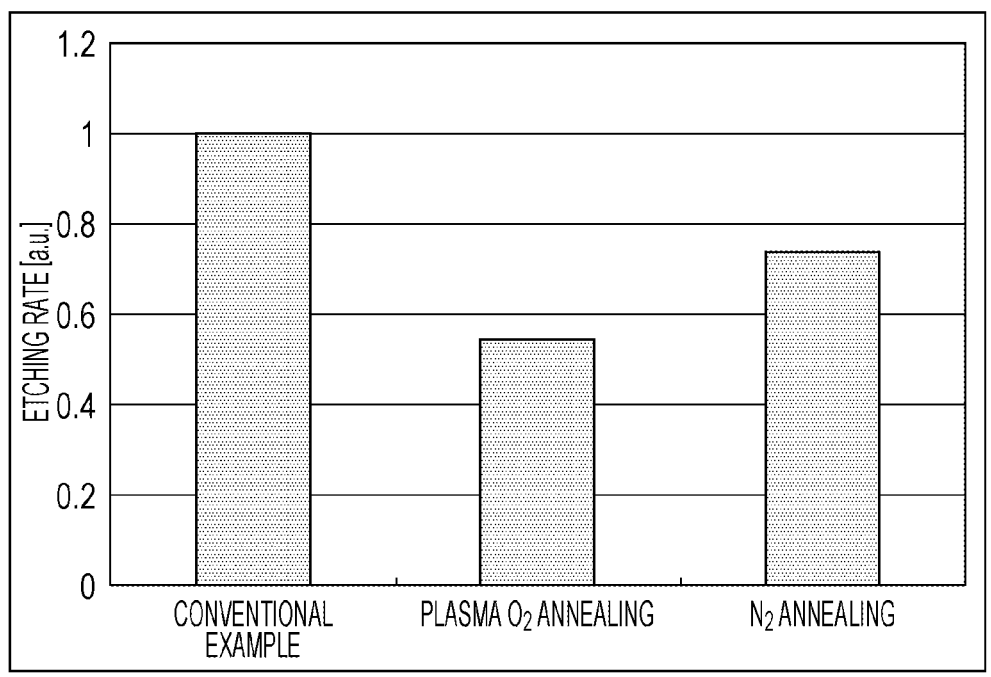
FIG. 10 compares the etching rates of films formed in a conventional example and the first and second embodiments of the present invention.

FIG. 10 compares the wet etching rates (WER) of a conventional silicon oxide film and silicon oxide films in the second and third embodiments. Specifically, the conventional silicon oxide film was formed with $Si_2Cl_6$, $H_2O$ and pyridine. The silicon oxide film in the second embodiment was formed with $Si_2Cl_6$, $H_2O$ and pyridine and then subjected to the plasma heat treatment using $O_2$ plasma. The silicon oxide film in the third embodiment was formed with $Si_2Cl_6$, $H_2O$ and pyridine and then subjected to the heat treatment using $N_2$. For the measurement of the WER, 1% dilute hydrofluoric acid is used. In general, as a film contains a larger amount of water, it tends to exhibit an increased WER. Accordingly, the WER of the film is considered to reflect the concentration of water contained therein. FIG. 10 reveals that the silicon oxide film subjected to the plasma treatment using $O_2$ plasma exhibits a lower WER than the conventional one. Thus, it can be found that the concentration of water in this film decreases. Moreover, the WER of the silicon oxide film subjected to the heat treatment using $N_2$ does not decrease as markedly as that subjected to the plasma treatment using $O_2$ plasma, but is still lower than that of the conventional one. Thus, it can be found that the concentration of water in this film also decreases.

In the example described above, $Si_2Cl_6$ is used as a silicon source; however any other source may be used. For example, an organic compound containing Si may be used. For example, tris dimethylamino silane (TDMAS, $SiH(N(CH_3)_2)_3$), dichlorosilane ($SiH_2Cl_2$), trichlorosilane ($SiCl_4$), bistertial butyl aminosila (BTBAS), bisdiethylamino silane (BDEAS), bisdiethyl methylamino silane (BDEMAS), tris dimethylamino silane (TDMAS), or hexamethyldisilazane (HMDS) may be used. When such the organic compound containing Si is used for silicon oxide films, the carbon contained in the silicon oxide films can improve their qualities and WER.

In the example described above, $H_2O$ is used as an oxidation source; however any other oxidation source can be used. Specifically, the oxidation source needs to have a property of containing atoms differing in electronegativity and being electrically biased. A reason is that a catalyst reacts with electrically biased molecules, and decreases the activation energy of a source gas, facilitating the reaction. In the light of the above reason, for example, $H_2O$, $H_2O_2$, $H_2+O_2$ mixture plasma or $H_2+O_3$ that has an OH bond can be used for the oxidation source. However, a nonpolar molecule, such as $O_2$ or $O_3$, is not preferred.

In the example described above, pyridine is used as a catalyst; however any other catalyst can be used. Any other catalyst having an acid dissociation constant pKa of approximately 5 to 7 may be used. Such catalysts include pyridine, aminopyridine, picoline, piperazine and lutidine.

In the example described above, $O_2$ is used for a source subjected to a post-process using plasma; however any other source can be used. One exemplary the source is $NH_3$. For example, use of $NH_3$ makes it possible to remove moisture from a SiO film. In this case, a SiO film is not formed entirely, and a SiON film containing N is formed locally. Nevertheless, Si—O—N bonds replacing Si—H bonds improve the WER.

Any other activation substance can be used instead of plasma. For example, a post-process may be performed using light or a microwave. Furthermore, in the example described above, a plasma treatment or a heat treatment is performed alone or both of these are performed in combination; however they may be sequentially performed. For example, the heat and the plasma treatments may be performed in this order, or the plasma and the heat treatments may be performed in this order.

Moreover, the present invention is applicable to silicon sources, as well as High-K films (metal oxide films made of TiO, ZrO or TiSiO and the like) for which a metal source is used.

In the example described above, a substrate processing apparatus, which is a batch type lateral apparatus configured to process a plurality of substrates at once, is used; however any other apparatus configuration may be used. For example, a single-wafer type substrate processing apparatus, configured to process one or more substrates at once, may be used. In addition, the present invention may support not only the use of a hot-water type process furnace, but also the use of a cold-water type process furnace.

A method of manufacturing a semiconductor device according to an aspect of the present invention can form silicon oxide films that exhibit a higher film quality and a lower etching rate than conventional silicon oxide films. In addition, when those films can be used as mask materials, they exhibit high resistance against deformation and reduction.

The above method can decrease the etching rate in comparison with conventional silicon oxide films formed with plasma. This method can also control stress applied to SiO films by controlling at least one of the inner temperature of a process chamber at a post-processing step and a time period over which a modification gas is supplied.

The above method enables both a film-forming process and a post-process to be performed in-situ at a lower temperature. It is thus possible to reduce device damages and thermal budgets, and to increase time efficiency, thereby enhancing productivity.

Preferred aspects of the present invention will be described below.

APPENDIX 1

A method of manufacturing a semiconductor device is provided, which includes:
forming a film on a substrate by alternately supplying at least a source gas and a reactive gas to the substrate while maintaining the substrate at a first temperature by heating; and modifying the film by supplying a modification gas excited by plasma to the substrate with the film formed thereon while naturally cooling the substrate with the film formed thereon to a second temperature without heating the substrate, the second temperature being lower than the first temperature.

APPENDIX 2

It is preferable for the first temperature to be a predetermined temperature of 200° C. or less.

APPENDIX 3

It is preferable for the first temperature to be a predetermined temperature of 100° C. or less.

APPENDIX 4

It is preferable for the first temperature to be a predetermined temperature in a range from 65° C. to 90° C.

APPENDIX 5

In the forming of the film, a catalyst is preferably supplied to the substrate simultaneously with at least one of the source gas and the reactive gas.

APPENDIX 6

In the forming of the film, the catalyst is preferably supplied to the substrate simultaneously with the source gas and the reactive gas.

APPENDIX 7

It is preferable for the reactive gas to be an oxygen-containing gas and the film to be an oxide film.

APPENDIX 8

It is preferable for the reactive gas to be at least one of $H_2O$ and $H_2O_2$.

APPENDIX 9

It is preferable for the modification gas to be an oxygen-containing gas or a nitrogen-containing gas.

APPENDIX 10

It is preferable for the source gas to be a silicon-containing gas and formed of a halide or an organic compound, and the film to be a silicon oxide film.

APPENDIX 11

It is preferable for the silicon-containing gas to have a molecular structure that does not contain oxygen.

APPENDIX 12

The modifying of the film is preferably performed for at least one hour at a pressure of 1 Torr or less.

APPENDIX 13

The forming of the film and the modifying of the film are preferably performed in sequence within the same process chamber.

APPENDIX 14

In the modifying of the film, stress applied to the modified film is preferably controlled by controlling at least one of the second temperature and a time period over which the modification gas excited by the plasma is supplied to the substrate.

APPENDIX 15

It is preferable for the second temperature to be a predetermined temperature of 40° C. or less.

APPENDIX 16

According to another aspect of the present invention, a substrate processing apparatus is provided, which includes:
a process chamber configured to accommodate a substrate;
a source gas supply system configured to supply a source gas to the substrate within the process chamber;
a reactive gas supply system configured to supply a reactive gas to the substrate within the process chamber;
a modification gas supply system configured to supply a modification gas to the substrate within the process chamber;
a plasma exciting unit configured to excite the modification gas by using plasma;
a heating system configured to heat the substrate within the process chamber; and
a control unit configured to control the source gas supply system, the reactive gas supply system, the modification gas supply system, the plasma exciting unit, and the heating system to perform a process of forming a film on the substrate by alternately supplying the source gas and the reactive gas to the substrate while maintaining the substrate accommodated within the process chamber at a first temperature by heating, and a process of modifying the film by supplying a modification gas excited by the plasma to the substrate with the film formed thereon while naturally cooling the substrate with the film formed thereon to a second temperature without heating the substrate, the second temperature being lower than the first temperature.

APPENDIX 17

The plasma exciting unit is preferably configured to be partitioned within the process chamber and to include a buffer chamber that is connected to the modification gas supply system and electrodes that generate plasma within the buffer chamber by being supplied with high-frequency power, and the modification gas is preferably excited within the buffer chamber by the plasma and then supplied to the substrate.

APPENDIX 18

The control unit is preferably configured to control the heating system to stop heating the substrate when the modification gas excited by the plasma is supplied to the substrate.

APPENDIX 19

According to still another aspect of the present invention, a program causes a computer to perform:
forming a film on a substrate accommodated within a process chamber in a substrate processing apparatus by alternately supplying at least a source gas and a reactive gas to the substrate while maintaining the substrate at a predetermined first temperature of 200° C. or less by heating; and
modifying the film formed on the substrate by supplying a modification gas excited by plasma to the substrate with the film formed thereon while naturally cooling the substrate with the film formed thereon to a second temperature without heating the substrate, the second temperature being lower than the first temperature.

This application claims the benefit of the priority based on Japanese Patent Application 2012-073749 filed Mar. 28, 2012, the entire content of which is incorporated herein by reference.

INDUSTRIAL APPLICABILITY

It is possible to improve the film quality when a film is formed on a substrate at a low temperature, thus forming fine patterns.

REFERENCE SIGNS LIST

200 wafer
201 process chamber
202 process furnace
203 reaction tube
231 exhaust pipe
243e valve
280 controller
310, 320, 330, 340 gas supply pipe
410, 420, 430, 440 nozzle

The invention claimed is:

1. A method of manufacturing a semiconductor device comprising:
   forming a film on a substrate by alternately supplying at least a source gas and a reactive gas to the substrate while maintaining the substrate at a first temperature of 200° C. or less by heating; and
   modifying the film and removing moisture from the film by supplying a nitrogen-containing modification gas excited by plasma to the substrate with the film formed thereon while naturally cooling the substrate with the film formed thereon to a second temperature without heating the substrate, the second temperature being lower than the first temperature.

2. The method according to claim 1, wherein the second temperature is predetermined to be 40° C. and the method further comprises naturally cooling the substrate with the film formed thereon to a cooled temperature equal to or less than the second temperature.

3. The method according to claim 1, wherein the modification gas comprises $NH_3$ gas.

4. The method according to claim 1, wherein modifying the film comprises controlling a stress applied to the film by at least one of: (i) the second temperature; and (ii) a time period in which the modification gas excited by the plasma is supplied to the substrate.

5. The method according to claim 1, wherein forming the film further comprises supplying a catalyst to the substrate simultaneously with at least one of the source gas and the reactive gas.

6. The method according to claim 1, wherein forming the film further comprises supplying the catalyst to the substrate simultaneously with the source gas and the reactive gas.

7. A method of processing a substrate comprising:
forming a film on a substrate by alternately supplying at least a source gas and a reactive gas to the substrate while maintaining the substrate at a first temperature of 200° C. or less by heating; and
modifying the film and removing moisture from the film by supplying a nitrogen-containing modification gas excited by plasma to the substrate with the film formed thereon while naturally cooling the substrate with the film formed thereon to a second temperature without heating the substrate, the second temperature being lower than the first temperature.

\* \* \* \* \*